(12) United States Patent
Anholt (10) Patent No.: US 8,650,467 B1
(45) Date of Patent: Feb. 11, 2014

(54) PARALLEL CHIEN SEARCH OVER MULTIPLE CODE WORDS

(75) Inventor: Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/555,816

(22) Filed: Jul. 23, 2012

(51) Int. Cl.
*H03M 13/00* (2006.01)

(52) U.S. Cl.
USPC .......................................................... 714/781

(58) Field of Classification Search
USPC .................................. 714/758, 782, 784, 785
See application file for complete search history.

(56) References Cited

U.S. PATENT DOCUMENTS

| | | | |
|---|---|---|---|
| 5,844,919 A * | 12/1998 | Glover et al. | 714/769 |
| 6,581,180 B1 | 6/2003 | Weng | |
| 6,637,002 B1 * | 10/2003 | Weng et al. | 714/781 |
| 7,805,662 B2 | 9/2010 | Ma et al. | |
| 2008/0215956 A1 | 9/2008 | Williamson et al. | |
| 2009/0292976 A1 * | 11/2009 | Kikuchi et al. | 714/784 |
| 2010/0332955 A1 * | 12/2010 | Anholt | 714/781 |
| 2011/0004812 A1 | 1/2011 | Yang | |
| 2011/0239094 A1 | 9/2011 | Kwok et al. | |

* cited by examiner

*Primary Examiner* — Albert Decady
*Assistant Examiner* — Osman Alshack
(74) *Attorney, Agent, or Firm* — Meyertons, Hood, Kivlin, Kowert & Goetzel, P.C.

(57) ABSTRACT

A method for decoding an ECC, in a decoder that includes at least first and second root search units, includes accepting at least first and second Error Locator Polynomials (ELPs) that have been computed over respective first and second code words of the ECC. A criterion depending on the ELPs is evaluated. One of first and second modes is selected based on the criterion. One or more first roots of the first ELP and one or more second roots of the second ELP are found using the selected mode, and the first and second code words are decoded using the first and second roots. In the first mode, the first and second root search units are combined and simultaneously find the first roots. In the second mode, the first and second root search units operate separately, and simultaneously identify the first roots and the second roots, respectively.

24 Claims, 4 Drawing Sheets

PARALLEL CHIEN SEARCH OVER MULTIPLE CODE WORDS

FIELD OF THE INVENTION

The present invention relates generally to Error Correction Coding (ECC), and particularly to methods and systems for high-performance ECC decoding.

BACKGROUND OF THE INVENTION

Error Correction Codes (ECC) are used in a variety of applications, such as in various digital communication and data storage applications. Some ECC decoders apply a multistage process, which decodes ECC code words by calculating syndromes of the code words, using the syndromes to generate Error Locator Polynomials (ELPs) whose roots indicate the error locations in the code words, finding the ELP roots, and thus correcting the errors. Some ECC types that are commonly decoded using such a process comprise, for example, Bose-Chaudhuri-Hocquenghem (BCH) codes and Reed-Solomon (RS) codes.

Various schemes for generating ELPs from syndromes are known in the art. Some well-known schemes comprise, for example, the Berlekamp-Massey algorithm, the Euclidean algorithm and the Peterson Gorenstein Zierler algorithm. Examples of methods for determining ELPs are described, for example, by Lin and Costello in "Error Control Coding Fundamentals," Prentice Hall, second edition, 2004, chapter 6, pages 209-215, and chapter 7, pages 241-255; and by Blahut in "Algebraic Codes for Data Transmission," Cambridge University Press, 2004, chapter 6, pages 131-166, and chapter 7, pages 179-190 and 217-223, which are incorporated herein by reference.

A method for finding ELP roots is described by Chien in "Cyclic Decoding Procedure for the Bose-Chaudhuri-Hocquenghem Codes," IEEE Transactions on Information Theory, vol. IT-10, October, 1964, pages 357-363, which is incorporated herein by reference. This method is commonly known as the "Chien search." Chen and Parhi describe hardware configurations that perform parallel Chien search, in "Small Area Parallel Chien Search Architectures for Long BCH Codes," IEEE Transactions on Very Large Scale Integration (VLSI) Systems, Vol. 12, No. 5, May 2004, pages 545-549, which is incorporated herein by reference.

U.S. Patent Application Publication 2010/0332955, whose disclosure is incorporated herein by reference, describes a method for decoding an ECC. The method includes accepting coefficients, including at least first and second coefficients, of an ELP that is defined over a vector space and has at least one root that is indicative of a location of an error in a set of bits, which represent data that has been encoded with the ECC. The first coefficient is represented using a first basis of the vector space, and the second coefficient is represented using a second basis of the vector space, different from the first basis. Using processing circuitry, the root of the ELP is identified by applying algebraic operations to the coefficients, such that the algebraic operations are applied to the first coefficient using the first basis, and to the second coefficient using the second basis. The error is corrected responsively to the identified root of the ELP.

SUMMARY OF THE INVENTION

An embodiment of the present invention that is described herein provides a method for decoding an Error Correction Code (ECC) in a decoder that includes at least first and second root search units. The method includes accepting at least first and second Error Locator Polynomials (ELPs) that have been computed over respective first and second code words of the ECC. A criterion depending on the first and second ELPs is evaluated. One of first and second modes is selected based on the evaluated criterion. One or more first roots of the first ELP and one or more second roots of the second ELP are found using the selected mode, and the first and second code words are decoded using the first and second roots. In the first mode, the first and second root search units are combined and simultaneously find the first roots. In the second mode, the first and second root search units operate separately, and simultaneously identify the first roots and the second roots, respectively.

In some embodiments, evaluating the criterion includes evaluating a rank of at least one of the first and second ELPs. In an embodiment, the first root search unit is capable of finding the roots for ELPs of up to a first rank, the second root search unit is capable of finding the roots for ELPs of up to a second rank, and evaluating the criterion includes comparing a rank of the first ELP to the first and second ranks.

In a disclosed embodiment, the first root search unit is capable of processing up to a first number of respective ELP coefficients, the second root search unit is capable of processing up to a second number of the respective ELP coefficients, and finding the first roots in the first mode includes combining the first and second root search units to process up to a sum of the first and second numbers of the respective ELP coefficients of the first ELP.

In another embodiment, the ECC is defined so as to correct up to a maximum number of errors per code word, and each of the first and second root search units is capable of correcting less than the maximum number of errors that is correctable by the ECC. In yet another embodiment, the ECC is defined so as to correct up to a maximum number of errors per code word, and evaluating the criterion and selecting the mode include choosing the first mode when a rank of the first ELP exceeds half the maximum number of errors, and choosing the second mode when respective ranks of the first and second ELPs both do not exceed half the maximum number of errors.

In still another embodiment, selecting the mode includes initially choosing the second mode by pre-assigning the first and second root search units to respective first and second decoding channels, and switching from the second mode to the first mode upon identifying in the first decoding channel that the first code word has a number of errors that is too high for the first root search unit to locate. In an example embodiment, accepting the ELPs includes receiving a communication signal that carries the first and second code words, and deriving the first and second ELPs from the received first and second code words.

In some embodiments, accepting the ELPs includes retrieving the first and second code words from a memory, and deriving the first and second ELPs from the retrieved first and second code words. In an embodiment, the first and second root search units are implemented using respective first and second sets of registers coupled to a single array of multipliers, and finding the first and second roots includes applying the multipliers to the respective first and second sets of registers.

In a disclosed embodiment, the first and second root search units include respective first and second multiplier arrays, and the method includes, in the first mode, applying logic external to the root search units to multiply a first output of the first root search unit by a factor and combine the multiplied first output with a second output of the second root search unit. In another embodiment, the first and second root search units includes respective first and second multiplier arrays, and the method includes, in the first mode, multiplying a first output of the first multiplier array by a factor in the first root search unit, and combining the multiplied first output with a second output of the second root search unit using logic external to the root search units.

There is additionally provided, in accordance with an embodiment of the present invention, apparatus for decoding an Error Correction Code (ECC) including at least first and second root search units and circuitry. The root search units are each configured to find roots of Error Locator Polynomials (ELPs) derived from code words of the ECC. The circuitry is configured to evaluate a criterion depending on at least first and second ELPs that have been computed over respective first and second code words of the ECC, to select one of first and second modes based on the evaluated criterion, to configure the root search units to find one or more first roots of the first ELP and one or more second roots of the second ELP using the selected mode, and to decode the first and second code words using the first and second roots. In the first mode, the first and second root search units are combined and configured to simultaneously find the first roots. In the second mode, the first and second root search units are configured to operate separately, and to simultaneously identify the first roots and the second roots, respectively.

The present invention will be more fully understood from the following detailed description of the embodiments thereof, taken together with the drawings in which:

DETAILED DESCRIPTION OF EMBODIMENTS

Overview

Some ECC decoders accept input code words that may contain errors, and operate on each input code word to produce multiple syndromes of the code word. Using the syndromes, such an ECC decoder generates an Error Locator Polynomial (ELP) whose roots are indicative of locations of errors in the code word. The ECC decoder then finds the ELP roots, and corrects the errors indicated by the roots.

Embodiments of the present invention that are described herein provide improved methods and apparatus for ECC decoding, which reduce the hardware size and power consumption of the circuitry that identifies the ELP roots. These techniques are suitable for various kinds of ECC that use syndromes and ELPs, such as Bose-Chaudhuri-Hocquenghem (BCH) codes and Reed-Solomon (RS) codes.

In some embodiments, an ECC decoder comprises an error location unit, which receives ELPs derived from respective input code words and finds the roots of the ELPs. The error location unit comprises multiple root search units, each capable of finding ELP roots up to a certain ELP rank (i.e., to find error locations in code words containing up to a certain number of errors).

The error location unit, however, comprises combining logic that can selectively combine two or more root search units to produce an equivalent root search unit. The equivalent root search unit is capable of finding the roots of higher-rank ELPs.

In some embodiments, the error location unit examines the ELPs that are pending for processing, and decides whether to operate each individual root search unit separately or to combine two or more of the root search units. In other words, the error location unit selects an operational mode for the root search units based on a criterion related to the pending ELPs. In one mode, the root search units operate simultaneously but separately from one another, and each unit finds the roots of a different ELP. In another mode, two or more of the root search units operate simultaneously and are combined to jointly find the roots of a single high-rank ELP.

The disclosed error location unit configurations can also be viewed as a single root search unit, which can either operate on a high-rank ELP or be partitioned into two or more sections that simultaneously operate on two or more lower-rank ELPs. Several example criteria for selecting the appropriate mode, and several example applications and system configurations that use the disclosed techniques, are described herein.

In practice, the vast majority of code words will typically contain far less errors than the maximum number of errors per code word that are correctable by the ECC being used. The disclosed techniques enable dimensioning the individual root search units to handle a relatively small number of errors per code word, which is sufficient for decoding the vast majority of code words. When a higher number of errors is encountered in a given code word, this code word is decoded by temporarily combining two or more root search units. Thus, the methods and systems described herein are highly efficient in terms of hardware size, cost and power consumption, with little or no degradation in error correction capability or other performance.

System Description

Figure 1:
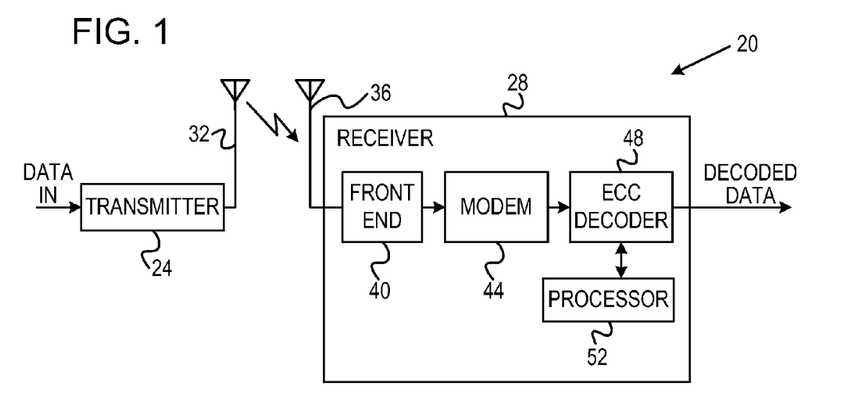
FIG. 1 is a block diagram that schematically illustrates a communication system that employs Error Correction Coding (ECC), in accordance with an embodiment of the present invention.

FIG. 1 is a block diagram that schematically illustrates a wireless communication system 20 that employs error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
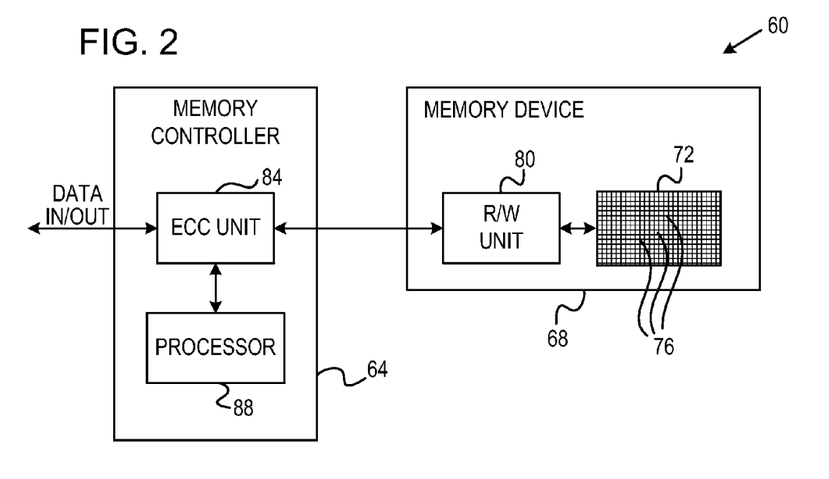
FIG. 2 is a block diagram that schematically illustrates a data storage system that employs ECC, in accordance with an embodiment of the present invention.

FIG. 2 is a block diagram that schematically illustrates a data storage system 60 that employs error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a suitable BCH or RS code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Figure 3:
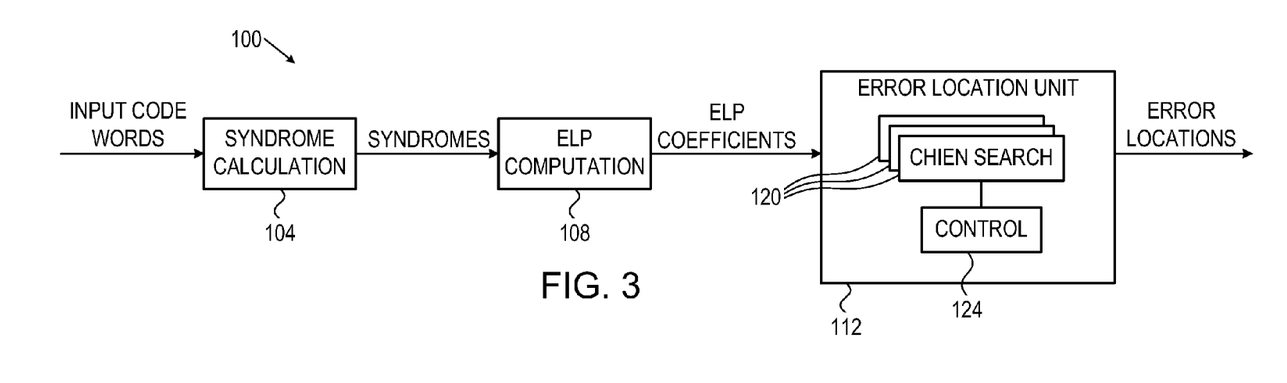
FIG. 3 is a block diagram that schematically illustrates an ECC decoder, in accordance with an embodiment of the present invention.

FIG. 3 is a block diagram that schematically illustrates an ECC decoder 100, in accordance with an embodiment of the present invention. Decoder 100 can be used to implement decoder 48 of FIG. 1 above, or ECC unit 84 of FIG. 2 above. Decoder 100 accepts ECC code words, which may contain errors. In other words, the input code words may not always comprise valid code words of the ECC. The ECC decoder decodes the input code words while attempting to correct these errors, so as to reconstruct the data conveyed in the code words. In a typical implementation, each code word comprises on the order of several hundred to several thousand bits, although any other suitable code word size can be used.

Decoder 100 comprises a syndrome calculation unit 104, which calculates a syndrome for each input code word. The syndrome is typically defined as $Hy=S$, wherein H denotes the parity check matrix of the ECC, y denotes an input code word and S denotes a vector of syndromes of code word y, denoted $S_1, S_2, S_3 \ldots$. When input code word y contains no errors, i.e., when y is a valid code word, $Hy=0$.

When the ECC is defined over a certain finite Galois Field (GF) having a primitive field element (also referred to as a field-generating element) $\alpha$, the $k^{th}$ syndrome $S_k$ can typically be written as $$S_k = \sum_{i=0}^{n-1} b_i \alpha^{ki}$$

(or as $$S_k = \sum_{i=0}^{n-1} b_i \alpha^{n-1-ki}$$

if the bit order is reversed), wherein $b_i$ denote the bits of the input code word. For a BCH code, coefficients $b_i$ are elements of the field GF (p), and each syndrome $S_k$ is an element of the field $GF(p^m)$. For a Reed-Solomon code, both coefficients $b_i$ and the syndromes $S_k$ are elements of the field $GF(p^m)$. The description that follows refers mainly to codes defined over $GF(2^m)$, although the methods and systems described herein are applicable to codes defined over any other suitable field. In a typical implementation, m=4 ($2^m=16$), although any other suitable value of m can also be used. Unit 104 typically computes and outputs a set of syndromes for each input code word.

(The description given herein refers mainly to BCH and RS codes, although it is applicable, mutatis mutandis, to various other codes that are defined by multiples of a given polynomial. In general, the syndromes are produced by applying the roots of this polynomial to the received code word.)

The syndromes output by unit 104 are processed by an Error Locator Polynomial (ELP) computation unit 108. For a given set of syndromes corresponding to a given code word, unit 108 determines an ELP defined over $GF(2^m)$ whose roots are indicative of the error locations in the given code word. The ELP can be written as $ELP(x)=1+a_1x+a_2x^2+ \ldots +a_jx^j$, wherein j denotes the rank of the ELP, j≤T. T denotes the maximum number of errors that the ECC is able to correct per code word. Unit 108 may apply any suitable method in order to compute the ELP for a given code word, such as, for example, the Berlekamp-Massey method, the Euclidean method or the Peterson Gorenstein Zierler method, cited above.

Unit 108 provides the ELP coefficients $a_1 \ldots a_j$ of each code word to an error location unit 112. Unit 112 determines the roots of the ELP, i.e., the elements x of $GF(2^m)$ for which $ELP(x)=0$, using techniques that are described in detail below. For a given code word, the ELP roots are indicative of the locations of the errors within the code word. ECC decoder 100 then corrects the errors at the identified locations. For a binary code such as binary BCH, the ELP roots identify the erroneous bits in the code word, and the decoder corrects the errors by reversing the values of the identified bits. In a non-binary code such as non-binary BCH or RS, on the other hand, the ELP roots indicate the erroneous symbols in the code words. In this case, decoder 100 determines the error values in addition to the error locations in order to correct the errors. The correction functionality can be carried out either by unit 112 or by other circuitry (not shown in the figure) in decoder 100.

In the disclosed embodiments, error location unit 112 comprises two or more root search units 120, also referred to as Chien search units. Each unit 120 is capable of finding ELP roots up to a certain maximum ELP rank. For higher-rank ELPs, error location unit 112 is configured to combine two or more root search units 120 such that the combined units are capable of finding the roots of the higher-rank ELP. A control unit 124 decides when to operate each unit 120 individually and when to combine units 120 to operate jointly on a given ELP. The structure and functionality of error location unit 112 and its elements are addressed in detail further below.

ECC decoder 48 of FIG. 1, ECC unit 84 of FIG. 2 and ECC decoder 100 of FIG. 3 may be implemented in software, in hardware, or using a combination of hardware and software elements. In some embodiments, decoder 48, unit 84 and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including units 104, 108, 112, 120 and 124) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements. The decoder elements other than root search units 120 are referred to as circuitry that carries out the functions described herein.

ECC Decoding Using Conditional Combining of Chien Search Units

Figure 4:
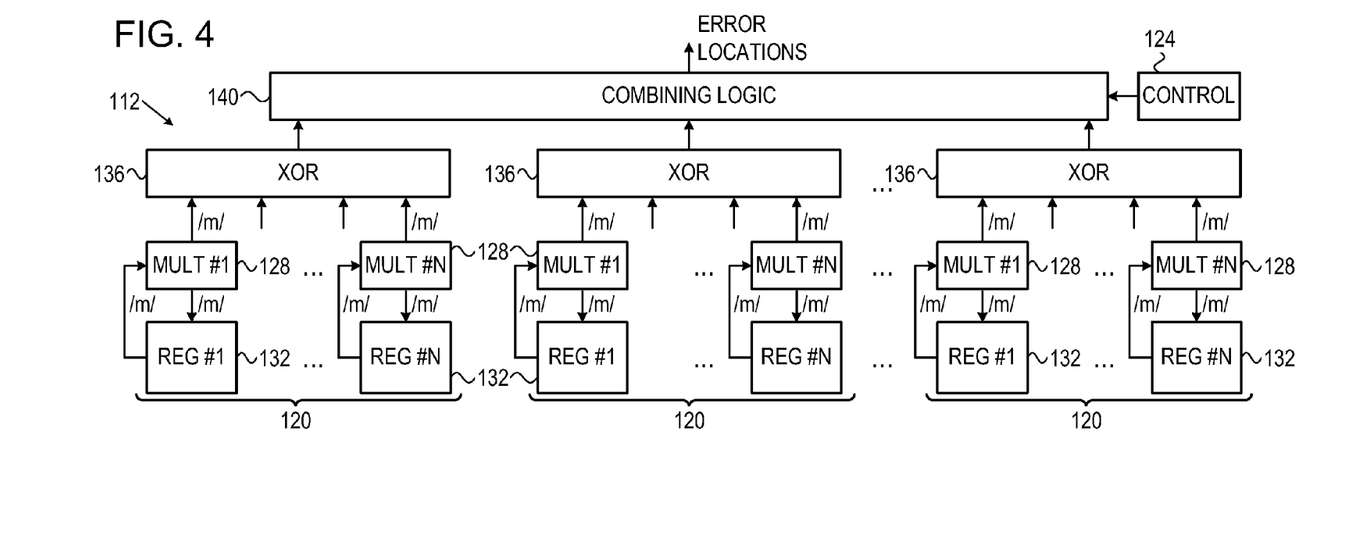
FIG. 4 is a block diagram that schematically illustrates an error location unit, in accordance with an embodiment of the present invention.

Typically, each root search unit 120 in error location unit 112 comprises a multiplier array. The multiplier array comprises one or more rows of m-bit multipliers. The array width, i.e., the number of multipliers in each row, is denoted N. An array of width N is capable of locating the roots of an ELP having a maximum rank of N, and thus to correct up to N errors per code word.

In some embodiments, units 120 are dimensioned such that N is (often considerably) smaller than T, wherein T denotes the maximum number of correctable errors per code word for the ECC being used. For example, when using a BCH code having T=100, units 120 may be designed with N=50. In other words, each unit 120 is capable of correcting up to fifty errors per code word, even though the BCH code in question is capable of correcting up to a hundred errors per code word.

Because of the statistical distribution of the number of errors per code word, the vast majority of the input code words will typically have N or fewer errors. Only a small percentage of the input code words will have more than N (and up to T) errors. Thus, when units 120 are dimensioned in this manner, a single unit 120 is capable of finding the ELP roots and enable error correction in the vast majority of the input code words.

In some embodiments, error location unit 112 is able to combine two or more root search units 120, such that the combined units are capable of correcting a higher number of errors per code word. A combination of k root search units is capable of finding k·N ELP roots, and thus enables correction of up to k·N errors per code word. As will be elaborated below, control unit 124 in unit 112 evaluates a certain criterion relating to the ELPs provided for searching, and decides whether to let each unit 120 operate separately or combine multiple units 120 to achieve higher error correction capability.

FIG. 4 is a block diagram that schematically illustrates error location unit 112, in accordance with an embodiment of the present invention. In the example, unit 112 comprises multiple root search units 120, e.g., four units, eights units or any other desired number of root search units. Each unit 120, as explained above, is capable of handling ELPs up to rank N, N<T. Any desired values of N and T can be used.

A given root search unit 120 comprises N registers 132, denoted REG#1 . . . REG#N. Unit 120 further comprises N multipliers 128, each multiplier 128 associated with a respective register 132. The multiplier that is associated with REG#K multiplies the content of this register by $\alpha^K$, wherein $\alpha$ denotes the field-generating element of the Galois field over which the ECC is defined. The output of each multiplier is fed back to the respective register 132.

Upon receiving an input code word for decoding, each register 132 is initialized with a respective ELP coefficient. Then, unit 120 evaluates the ELP on the different elements of the Galois field, in an attempt to find one or more field elements x for which ELP(x)=0. In order to apply the ELP to the different field elements, multipliers 128 operate on the content of registers 132 in a series of cycles. In a given cycle, the multipliers multiply the current contents of REG#1 . . . REG#N by $\alpha^1 \ldots \alpha^N$, respectively. The multiplication result is fed back into the respective registers in preparation for the next cycle.

Unit 120 comprises an Exclusive OR (XOR) unit 136, which calculates the XOR of the register outputs. Thus, after the $i^{th}$ multiplication cycle, XOR unit 136 outputs the value of the ELP at the field element $\alpha^i$. If the output of unit 136 is zero at this stage, unit 120 concludes that $\alpha^i$ is a root of the ELP, and therefore corresponds to an error location in the input code word.

In some embodiments, XOR unit 136 also accepts the constant term (free term) of the ELP as input (this input is not shown in the figure). When the ELP is written as ELP(x)=1+ $a_1x+a_2x^2+ \ldots +a_jx^j$, without loss of generality, the constant term is unity. In these embodiments, the output of XOR unit 136 is compared to zero in order to determine whether the currently-evaluated field element is an ELP root. In alternative embodiments, unit 136 accepts the outputs of registers 128 but not the constant term of the ELP. In these embodiments, the output of XOR unit 136 is compared to the value of the constant ELP term.

In the embodiment of FIG. 4, each register 132 is associated with a single respective multiplier 128. This configuration applies the ELP to a single field element in each cycle. In an alternative embodiment, the decoder may comprise multiple banks of multipliers, such that each register 128 is associated with two or more multipliers. In a given cycle, each bank of multipliers evaluates a different field element. This configuration enables the decoder to apply the ELP to two or more field elements in each cycle, and thus reduce the root identification time.

In the example of FIG. 4, all root search units 120 comprise a multiplier array of width N. In alternative embodiments, different root search units may have different array widths.

In the disclosed embodiments, unit 112 comprises combining logic 140, which carries out the selective combining of multiple units 120 under control of control unit 124. Logic 140 accepts the outputs of XOR units 136 of the various root search units 120. When control unit 124 decides that each unit 120 is to operate separately, then logic 140 merely relays the error locations (corresponding to the ELP roots) found by each unit 120, so that the errors in the corresponding code word can be corrected. If control unit 124 decides that a certain group of two or more units 120 are to be combined in order to operate on a high-rank ELP, logic 140 combines the desired root search units.

Combining logic 140 may use various techniques for combining multiple root search units 120 so as to imitate a higher-rank root search unit. Some of the combining techniques may also affect the design of units 120. As explained above, evaluating an ELP of rank M involves multiplying the contents of M registers REG#1 . . . REG#M by $\alpha^1 \ldots \alpha^M$, respectively, using an array of M multipliers, and iteratively feeding the result back into the respective registers. When M>N, logic 140 combines two or more units 120 such that their registers 132 are initialized with the M ELP coefficients, and such that their multipliers 128 multiply by the appropriate power of $\alpha$.

In some embodiments, root search units 120 are all identical in structure to one another (although possibly different in array width) and operate on different inputs. In these embodiments, when units 120 process the coefficients of the same ELP, combining logic 140 carries out the appropriate operations for combining the root search unit outputs. Consider, for example, a pair of identical units 120 whose operation is given by:

$$\sum_{i=1}^{T/2} a_i \alpha^i, \sum_{i=1}^{T/2} b_i \alpha^i$$

Operating on a higher-rank ELP can be written as:

$$\sum_{i=1}^{T} a_i \alpha^i$$

The Chien search typically attempts to find the error location k, which corresponds to the roots of the ELP:

$$\sum_{i=1}^{T/2} a_i \alpha^{ik} = 0$$

At each step, the multipliers of the root search unit multiply by successive powers of $\alpha$, such as $$\sum_{i=1}^{T/2} \alpha_i \alpha^i,$$

and then updates the registers to $\alpha_t \alpha^i \to \alpha_i$.

The two root search units can be combined to operate on the higher-rank ELP by having each unit operate on a subset of the ELP coefficients and multiplying the output of one of the units by the factor $\alpha^{kT/2}$:

$$\sum_{i=1}^{T} a_i \alpha^i = \sum_{i=1}^{T/2} a_i \alpha^i + \alpha^{kT/2} \sum_{i=1}^{T/2} a_{(i+T/2)} \alpha^i$$

The extra factor multiplication and XOR operations are carried out by combining logic 140. This computation can be implemented, for example, using an additional register and a multiplier by $\alpha^{T/2}$. In configurations of this sort, units 120 are typically identical in structure, but logic 140 has additional operations to perform. Any subset of units 120 can be selected and combined in any desired order to operate on high-rank ELPs.

In alternative embodiments, the root search units are not identical to one another, but on the other hand combining logic 140 is simple and performs only XOR. In these embodiments, the above-described multiplication by the factor $\alpha^{kT/2}$ does not need to be performed by one of the root search units. Consider, for example, a pair of root search units whose operation is given by:

$$\sum_{i=1}^{T/2} a_i \alpha^i, \sum_{i=1}^{T/2} a_i \alpha^{i+T/2}$$

The outputs of these two units can be combined by a simple XOR:

$$\sum_{i=1}^{T} a_i \alpha^i = \sum_{i=1}^{T/2} a_i \alpha^i + \sum_{i=1}^{T/2} a_i \alpha^{i+T/2}$$

This operation is equivalent to taking one large root search unit of size T and breaking it up into two search units that can operate separately.

In these embodiments, combining logic 140 is simple. On the other hand, since the root search units are not identical, they cannot be combined in any desired order. Further alternatively, unit 112 may comprise any other suitable type of root search units and logic 140 may combine them using any other suitable technique.

The configuration of root search units 120 shown in FIG. 4 is an example configuration that is chosen purely for the sake of conceptual clarity. In alternative embodiments, any other suitable root search unit configuration can be used. For example, the root search units may be implemented using serial multipliers. This sort of implementation is described, for example, in U.S. patent application Ser. No. 12/419,304, entitled "High-performance ECC decoder," which is assigned to the assignee of the present patent application and whose disclosure is incorporated herein by reference.

Figure 5:
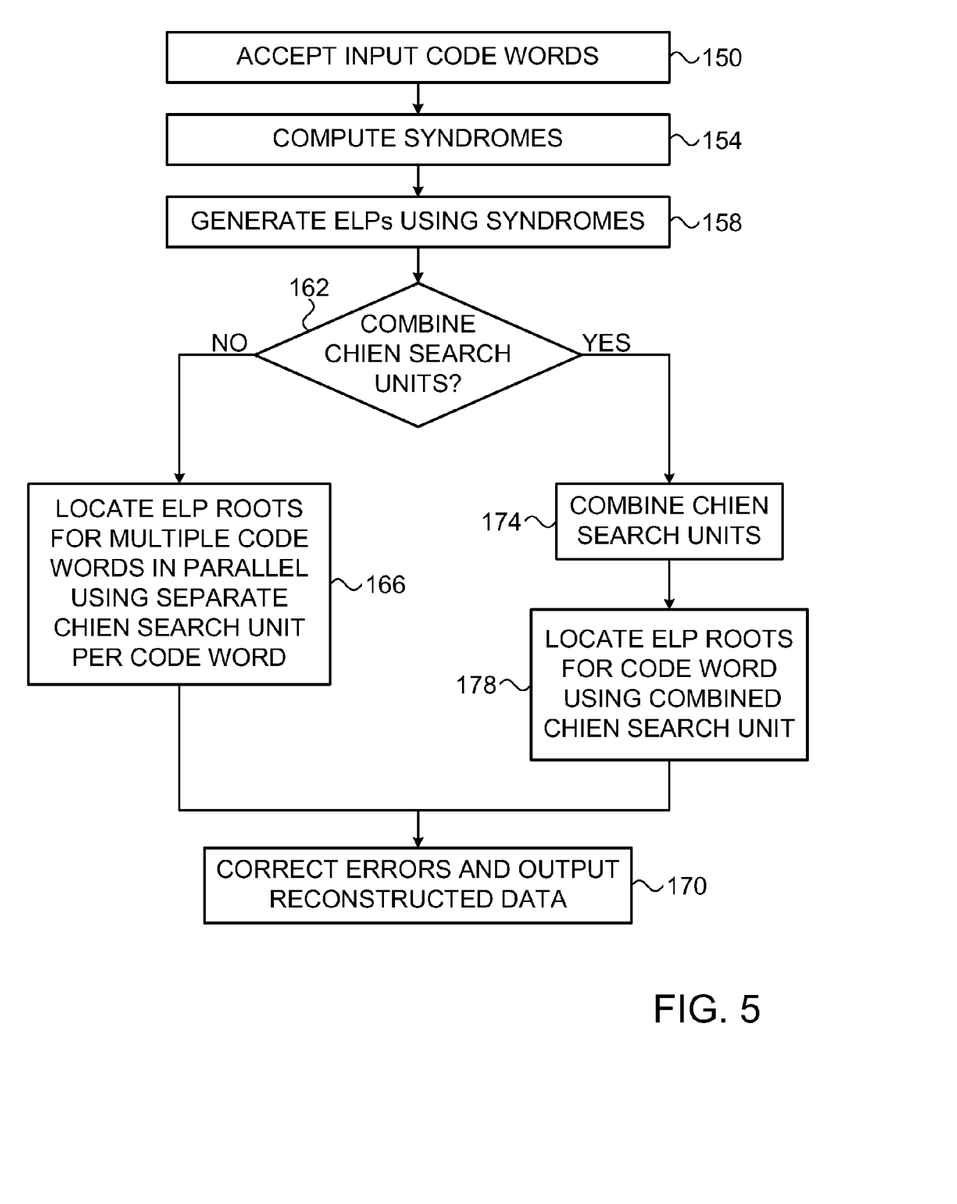
FIG. 5 is a flow chart that schematically illustrates a method for ECC decoding, in accordance with an embodiment of the present invention.

FIG. 5 is a flow chart that schematically illustrates a method for ECC decoding, in accordance with an embodiment of the present invention. The method begins with decoder 100 accepting input ECC code words for decoding, at an input step 150. Syndrome calculation unit 104 calculates syndromes for each input code word, at a syndrome calculation step 154. ELP computation unit 108 computes the ELP coefficients for each input code word based on the syndromes, at an ELP computation step 158.

Error location unit 112 corrects the errors in the input code words. Unit 112 typically uses units 120 to find the roots of each ELP, and thus the error locations in each input code word, and then corrects the errors at those locations.

When examining the ELPs received from unit 108, control unit 124 of error location unit 112 checks and decides whether or not to combine multiple units 120 for finding the ELP roots, at a combining checking step 162. The control unit may use various criteria for deciding whether to combine multiple units 120 or let each unit 120 operate separately. Several examples of criteria and use cases are described further below. The decision can be viewed as a selection between different modes—e.g., one mode in which each unit 120 operates on a different ELP, and another mode in which at least two of units 120 are combined to operate jointly on a single high-rank ELP.

If control unit 124 decides to let each root search unit 120 operate separately (e.g., when all the ELPs that are pending for processing are of rank N or lower), each root search unit 120 finds the roots of a different ELP derived from a different input code word, at a separate ELP processing step 166. In this mode, the multiple units 120 find the roots of multiple different respective ELPs simultaneously. Unit 112 then corrects the errors in the various input code words using the found ELP roots, at an error correction step 170.

If, on the other hand, control unit 124 decides to combine two or more units 120 to jointly find the roots of the same ELP (e.g., when a pending ELP has a rank greater than N), the control unit instructs combining logic 140 to combine two or more of units 120, at a combining step 174. In various embodiments, unit 124 may instruct logic 140 how many units 120 are to be combined (e.g., based on the rank of the ELP that necessitated the combining), possibly which specific units 120 are to be combined, and possibly which ELP is assigned to which unit 120 or group of combined units 120. Generally, control unit 124 may instruct logic 140 to configure units 120 to process any desired set of ELPs, such that some units 120 may be combined into groups and other units 120 may operate separately.

Units 120 and logic 140 then find the ELP roots in accordance with the configuration instructed by unit 124, at a combined ELP processing. In this mode, at least two of the root search units are combined so as to jointly and simultaneously find the roots of a given high-rank ELP. Unit 112 then corrects the errors in the various input code words using the found ELP roots, at error correction step 170.

Figure 6:
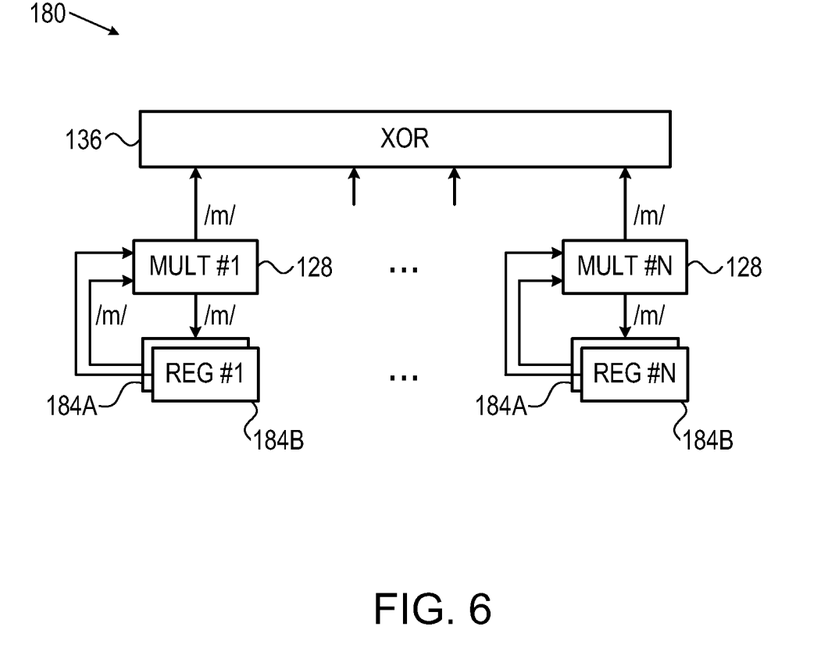
FIG. 6 is a block diagram that schematically illustrates a root search unit, in accordance with an alternative embodiment of the present invention.

FIG. 6 is a block diagram that schematically illustrates a root search unit 180, in accordance with an alternative embodiment of the present invention. In this example, the functionality of a pair of root search units 120 (FIG. 4), operating on different sets of ELP coefficients, is carried out by unit 180 utilizing two separate register sets. Unit 180 can thus be viewed as two root search units that may either operate separately on different respective ELPs, or jointly on a single high-rank ELP.

In unit 180, each multiplier 128 is coupled to two respective registers 184A and 184B. Initially, the N registers 184A hold a certain set of ELP coefficients and the N registers 184B hold another set of ELP coefficients. In one mode of operation, the two sets of coefficients correspond to different ELPs of rank N or lower. In a second mode of operation, the two sets of coefficients correspond to a single ELP of rank 2N or lower.

Each multiplier 128 may operate on the respective register 184A or on the respective register 184B. The multiplier outputs are provided to XOR unit 136. Typically, the multipliers operate iteratively on registers 184A, and then operate iteratively on registers 184A. In this manner, the two sets of ELP coefficients (either from the same ELP or from different ELPs) are processed using a single array of multipliers. When the two sets of registers operate of the same ELP, XOR unit 136 applies the appropriate operations for combining the multiplier outputs calculated on the sets of ELP coefficients.

As noted above with regard to units 120, FIG. 6 refers to a single row of multipliers for the sake of clarity. In alternative embodiments, unit 180 may comprise multiple rows of multipliers for increased parallelism. Although FIG. 6 shows each multiplier coupled to two registers for the sake of clarity, in alternative embodiments each multiplier may be coupled to a larger number of registers. The root search unit in such embodiments would function similarly to any desired number of root search units 120.

Example Use-Cases and Configurations

The disclosed techniques can be used in a wide variety of system configurations and use cases. Several examples are described below, but these examples are chosen purely for the sake of conceptual clarity. In alternative embodiments, the disclosed techniques can be used in any other suitable system configuration and application.

In one example embodiment, error location unit 112 comprises two root search units 120. Each unit 120 in this example comprises N=T/2 multipliers and N=T/2 corresponding registers, and is thus able to process ELPs up to rank T/2. Unit 112 receives a sequence of ELPs from ELP computation unit 108, and examines them in order of arrival. If the next two ELPs pending for processing are of rank N=T/2 or lower, control unit 124 instructs logic 140 such that the two units 120 will find the roots of the two respective ELPs simultaneously. If, on the other hand, the next pending ELP has a rank higher than N=T/2, control unit 124 instructs logic 140 to combine the two units 120 so as to find the roots of this ELP jointly. If the next pending ELP has a rank of N=T/2 or less, but the following ELP has a rank higher than N=T/2, then unit 124 instructs logic 140 to process the next ELP using one of units 120, and then to process the following ELP using both units 120 jointly.

In another example embodiment, control unit 124 may process the incoming ELPs out-of-order, i.e., in an order that is different from the order of arrival, so as to avoid situations in which one of the root search units is idle. For example, the control unit may examine the queue of pending ELPs, and select pairs of ELPs having ranks of N=T/2 or lower for simultaneous processing.

Note that the configuration of FIG. 4 above can also be viewed as a single wide array of multipliers and corresponding registers, which can operate in various modes. In one mode, the entire width of the array is dedicated to find the roots of a single high-rank ELP. In another mode, the array is divided into two or more sections, each section comprises a respective subset of the multiplier-register pairs, and the different sections operate simultaneously to find the roots of two or more lower-rank ELPs.

This sort of architecture can be used, for example, to flexibly partition the array into any desired number of subsets of any desired size. Using this partitioning, the array can process simultaneously any group of ELPs provided that the sum of their ranks does not exceed the array width. Put in another way, this partitioning enables unit 112 to simultaneously correct errors in any group of input code words as long as the total number of errors in the code words in the group does not exceed the array width.

The disclosed techniques can be used in various systems and system configuration. Consider, for example, a Solid State Disk (SSD) that stores data in multiple non-volatile memory devices, such as Flash devices. The memory devices are divided into groups. Each group of memory devices is referred to as a channel and is managed by a respective channel controller. A master controller communicates with a host and forward storage commands to the appropriate channel controllers. Among other tasks, each channel controller carries out ECC encoding and decoding.

In some embodiments, each channel is pre-assigned a respective root search unit 120. Units 120 are dimensioned so as to handle the vast majority of code words. For example, N may be set such that 99% of the code words read from memory have N errors or less. Under normal conditions, each channel controller reads code words from the memory devices and corrects the errors using its pre-assigned root search unit 120. If a channel controller encounters a rare situation in which a code word has more than N errors, the master controller may temporarily suspend readout in another channel, and temporarily combine the root search units of the two channels to decode the code word having the large number of errors.

In an alternative embodiment, the SSD may comprise, in addition to the root search unit pre-assigned to each channel, a pool of (one or more) spare root search units that can be assigned on-demand to increase the error correction capability of any channel. Further alternatively, the SSD may comprise a central pool of root search units without pre-assignment, and the root search units are assigned adaptively to the various channels and combined, so as to match the readout throughput and the numbers of errors per code word on the different channels.

In all of these configurations, the multiplier array width N of individual channels need not be dimensioned for the worst-case number of errors per code word, but for a considerably smaller number of errors that is met in the vast majority of code words. Therefore, the disclosed techniques are highly efficient in terms of cost, component size and power consumption. If a code word with a higher number of errors is encountered, it is decoded using additional resources imported from another channel or from a central pool. Thus, decoding performance is not compromised.

In some embodiments, the channel controller may decide not to combine its pre-assigned root search unit with another root search unit even when a high-rank ELP is encountered. In an example embodiment, the channel controller (or other memory controller) may decide not to correct the errors in a given code word, but to use the identified number of errors for a different purpose, such as for adjusting read thresholds for reading the non-volatile memory.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for decoding an Error Correction Code (ECC), the method comprising:

in a decoder that includes at least first and second root search units, accepting a plurality of Error Locator Polynomials (ELPs) that have been computed over a respective plurality of code words of the ECC;

selecting a first ELP and a second ELP from the plurality of ELPs dependent upon a rank of each ELP of the plurality of ELPs, wherein a rank of the first ELP and a rank of the second ELP are less than or equal to a threshold value;

evaluating a criterion depending on the first and second ELPs; and selecting one of first and second modes based on the evaluated criterion, finding one or more first roots of the first ELP and one or more second roots of the second ELP using the selected mode, and decoding a first code word and a second code word of the plurality of code words of the ECC using the first and second roots;

wherein in the first mode, the first and second root search units operate collectively to find the one or more first roots of the first ELP;

and wherein in the second mode, the first and second root search units operate separately, wherein the first root search unit finds the one or more first roots of the first ELP, and the second root search unit finds the one or more second roots of the second ELP, in parallel.

2. The method according to claim 1, wherein evaluating the criterion comprises evaluating a rank of at least one of the first and second ELPs.

3. The method according to claim 1, wherein the first root search unit is capable of finding the roots for ELPs of up to a first rank, wherein the second root search unit is capable of finding the roots for ELPs of up to a second rank, and wherein evaluating the criterion comprises comparing a rank of the first ELP to the first and second ranks.

4. The method according to claim 1, wherein the first root search unit is capable of processing up to a first number of respective ELP coefficients, wherein the second root search unit is capable of processing up to a second number of the respective ELP coefficients, and wherein finding the first roots in the first mode comprises combining the first and second root search units to process up to a sum of the first and second numbers of the respective ELP coefficients of the first ELP.

5. The method according to claim 1, wherein the ECC is defined so as to correct up to a maximum number of errors per code word, and wherein each of the first and second root search units is capable of correcting less than the maximum number of errors that is correctable by the ECC.

6. The method according to claim 1, wherein the ECC is defined so as to correct up to a maximum number of errors per code word, and wherein evaluating the criterion and selecting the mode comprise choosing the first mode when a rank of the first ELP exceeds half the maximum number of errors, and choosing the second mode when respective ranks of the first and second ELPs both do not exceed half the maximum number of errors.

7. The method according to claim 1, wherein selecting the mode comprises initially choosing the second mode by pre-assigning the first and second root search units to respective first and second decoding channels, and switching from the second mode to the first mode upon identifying in the first decoding channel that the first code word has a number of errors that is too high for the first root search unit to locate.

8. The method according to claim 1, wherein accepting the ELPs comprises receiving a communication signal that carries the first and second code words, and deriving the first and second ELPs from the received first and second code words.

9. The method according to claim 1, wherein accepting the ELPs comprises retrieving the first and second code words from a memory, and deriving the first and second ELPs from the retrieved first and second code words.

10. The method according to claim 1, wherein the first and second root search units are implemented using respective first and second sets of registers coupled to a single array of multipliers, and wherein finding the first and second roots comprises applying the multipliers to the respective first and second sets of the registers.

11. The method according to claim 1, wherein the first and second root search units comprise respective first and second multiplier arrays, and comprising, in the first mode, applying logic external to the root search units to multiply a first output of the first root search unit by a factor and combine the multiplied first output with a second output of the second root search unit.

12. The method according to claim 1, wherein the first and second root search units comprise respective first and second multiplier arrays, and comprising, in the first mode, multiplying a first output of the first multiplier array by a factor in the first root search unit, and combining the multiplied first output with a second output of the second root search unit using logic external to the root search units.

13. Apparatus for decoding an Error Correction Code (ECC), the apparatus comprising:
  at least first and second root search units, which are each configured to find roots of Error Locator Polynomials (ELPs) derived from code words of the ECC; and
  circuitry, which is configured to select a first ELP and a second ELP from a plurality of ELPs dependent upon a rank of each ELP of the plurality of ELPs, wherein a rank of the first ELP and a rank of the second ELP are less than or equal to a threshold value, wherein each ELP of the plurality of ELPs has been computed over a respective one of a plurality of code words of the ECC, evaluate a criterion depending on the first and the second ELPs, to select one of first and second modes based on the evaluated criterion, to configure the root search units to find one or more first roots of the first ELP and one or more second roots of the second ELP using the selected mode, and to decode a first code word and a second code word of the plurality of code words of the ECC using the first and second roots;
  wherein in the first mode, the first and second root search units operate collectively to find the one or more first roots of the first ELP;
  and wherein in the second mode, the first and second root search units operate separately, wherein the first root search unit finds the one or more first roots of the first ELP, and the second root search unit finds the one or more second roots of the second ELP, in parallel.

14. The apparatus according to claim 13, wherein the circuitry is configured to evaluate the criterion by evaluating a rank of at least one of the first and second ELPs.

15. The apparatus according to claim 13, wherein the first root search unit is configured to find the roots for ELPs of up to a first rank, wherein the second root search unit is configured to find the roots for ELPs of up to a second rank, and wherein the circuitry is configured to compare a rank of the first ELP to the first and second ranks.

16. The apparatus according to claim 13, wherein the first root search unit is configured to process up to a first number of respective ELP coefficients, wherein the second root search unit is configured to process up to a second number of the respective ELP coefficients, and wherein the circuitry is configured to find the first roots in the first mode by combining the first and second root search units to process up to a sum of the first and second numbers of the respective ELP coefficients of the first ELP.

17. The apparatus according to claim 13, wherein the ECC is defined so as to correct up to a maximum number of errors per code word, and wherein each of the first and second root search units is configured to correct less than the maximum number of errors that is correctable by the ECC.

18. The apparatus according to claim 13, wherein the ECC is defined so as to correct up to a maximum number of errors per code word, and wherein the circuitry is configured to choose the first mode when a rank of the first ELP exceeds half the maximum number of errors, and to choose the second mode when respective ranks of the first and second ELPs both do not exceed half the maximum number of errors.

19. The apparatus according to claim 13, wherein the circuitry is configured to initially choose the second mode by pre-assigning the first and second root search units to respective first and second decoding channels, and to switch from the second mode to the first mode upon identifying in the first decoding channel that the first code word has a number of errors that is too high for the first root search unit to locate.

20. The apparatus according to claim 13, and comprising a receiver, which is configured to receive a communication signal that carries the first and second code words, and wherein the circuitry is configured to derive the first and second ELPs from the received first and second code words.

21. The apparatus according to claim 13, and comprising a read/write unit that is configured to retrieve the first and second code words from a memory, and wherein the circuitry is configured to derive the first and second ELPs from the retrieved first and second code words.

22. The apparatus according to claim 13, wherein the first and second root search units are implemented using respective first and second sets of registers that are coupled to a single array of multipliers, and wherein the multipliers are configured to operate on the first and second sets of the registers so as to calculate the first and second roots, respectively.

23. The apparatus according to claim 13, wherein the first and second root search units comprise respective first and second multiplier arrays, and wherein, in the first mode, the circuitry is configured to multiply a first output of the first root search unit by a factor and combine the multiplied first output with a second output of the second root search unit.

24. The apparatus according to claim 13, wherein the first and second root search units comprise respective first and second multiplier arrays, and wherein, in the first mode, the first root search unit is configured to multiply a first output of the first multiplier array by a factor, and the circuitry is configured combine the multiplied first output with a second output of the second root search unit.

* * * * *